United States Patent [19]

Ebata

[11] Patent Number: 4,635,009
[45] Date of Patent: Jan. 6, 1987

[54] SURFACE ACOUSTIC WAVE RESONATOR

[75] Inventor: Yasuo Ebata, Yokohama, Japan

[73] Assignee: Kabushiki Kaisha Toshiba, Kawasaki, Japan

[21] Appl. No.: 807,446

[22] Filed: Dec. 10, 1985

[30] Foreign Application Priority Data

Dec. 17, 1984 [JP] Japan .................. 59-264426

[51] Int. Cl.[4] .............. H03H 9/25; H03H 9/145
[52] U.S. Cl. ................ 333/195; 310/313 D; 333/196
[58] Field of Search ............... 333/150–155, 333/193–196; 310/313 R, 313 A, 313 B, 313 C, 313 D; 331/107 A

[56] References Cited

U.S. PATENT DOCUMENTS

| 3,886,504 | 5/1975 | Hartmann et al. | 333/195 |
| 4,013,983 | 3/1977 | Hartemann | 333/195 |
| 4,387,355 | 6/1983 | Uno et al. | 333/195 |
| 4,454,488 | 6/1984 | Hartmann | 333/195 |

Primary Examiner—Marvin L. Nussbaum
Attorney, Agent, or Firm—Oblon, Fisher, Spivak, McClelland, & Maier

[57] ABSTRACT

An IDT is arranged at the center of a piezoelectric substrate formed of $Li_2B_4O_7$ single crystals. Grating reflectors are arranged on either side of the IDT. The IDT and the grating reflectors are formed of 6,000 Å thick aluminum films. The IDT comprises a pair of comb-shaped transducers having a plurality of electrode fingers which are arranged parallel to each other at equal distances, so that the electrode fingers of the respective transducers are alternately arranged. The grating reflectors have a plurality of reflective arrays arranged parallel to each other at equal distances. The pitch (Pg) between the reflective arrays of the grating reflectors, and the pitch (Pt) between the electrode fingers of the IDT is set to be 98.8% of half the wavelength of a surface acoustic wave in the resonance mode. Distance d between the IDT and the grating reflector is half the wavelength of a surface acoustic wave in the resonance mode. The total number of the electrode fingers of the IDT is 60 (30 pairs) and the total number of the reflective arrays of each grating reflector is 150 (the total number thereof is 300).

13 Claims, 15 Drawing Figures

F I G. 5A
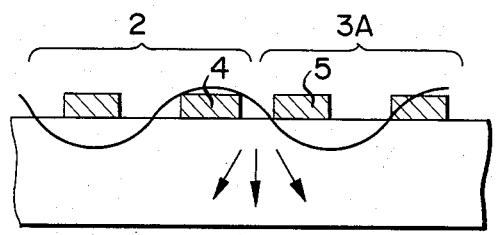
F I G. 5B
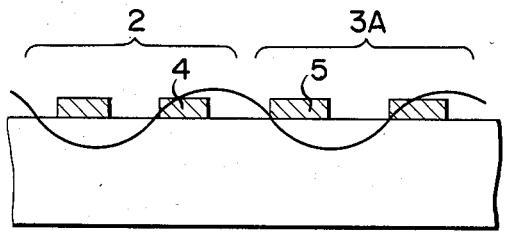
F I G. 6
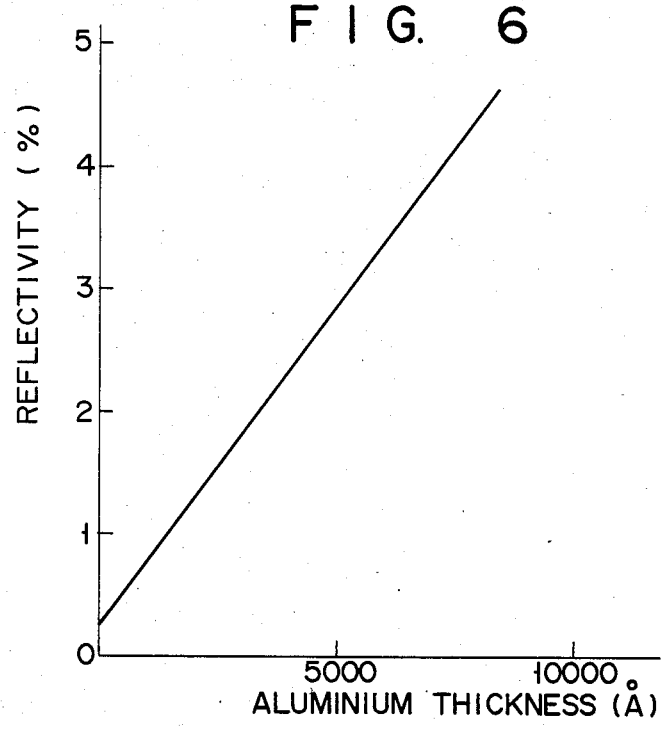

SURFACE ACOUSTIC WAVE RESONATOR

BACKGROUND OF THE INVENTION

The present invention relates to a surface acoustic wave resonator.

A conventional surface acoustic wave resonator was proposed by Clinton Silvester Hartmann et al. (U.S. Pat. No. 3,886,504). FIG. 1 shows its basic structure. Interdigital transducer (to be referred to as IDT hereinafter) 2, as a converter between an electric signal and a surface acoustic wave, is arranged at the center of the surface of piezoelectric substrate 1. IDT 2 comprises a pair of comb-shaped transducers having a plurality of electrode fingers 4 arranged parallel to each other at equal distances, so that fingers 4 of the respective transducers are alternately arranged. Grating reflectors 3A and 3B are arranged on either side of IDT 2, and each has a plurality of reflective arrays 5 arranged parallel to each other at equal distances.

When an excitation signal is supplied to IDT 2, a surface acoustic wave that propagates to both sides of IDT 2 along the substrate surface, is produced. The surface acoustic wave is reflected by opposed reflectors 3A and 3B, thus causing resonance therebetween. Energy from the surface acoustic wave, caused by this resonance, is re-converted into electric energy by IDT 2.

Different structures of reflective arrays 5 of reflectors 3A and 3B, shown in sectional views of FIGS. 2A to 2C, are well known. FIG. 2A shows reflective arrays formed by thin film conductors 7 on $LiNbO_3$ substrate 6. Reflection of a surface acoustic wave occurs since different portions of substrate 6 have different acoustic impedances depending upon the presence/absence of conductors 7.

When a reflective array comprises a thin film conductor, the reflectivity per reflective array is proportional to electromechanical coupling factor $K^2$ of substrate 6. A Y-Z $LiNbO_3$ substrate has a reflectivity of about 1.5%. However, reflective arrays with the above structure, arranged on a substrate with a small $K^2$, cannot provide sufficient reflectivity. For this reason, as shown in FIG. 2B, reflective arrays can be grooves 9 in a surface of substrate 8, or, as shown in FIG. 2C, reflective arrays can be steps 11 of dielectrics or metals formed on a surface of substrate 10.

When IDT 2 and grating reflectors 3A and 3B are arranged at appropriate positions on substrate 1, a surface acoustic wave resonator allows for an operation electrically equivalent to a resonance circuit having high selectivity Q with reference to a signal output terminal of IDT 2.

In general, as shown in FIG. 1, when reflective arrays 5 of reflectors 3A and 3B are arranged at distances P, equal to half the wavelength of a resonating surface acoustic wave, surface acoustic waves reflected from arrays 5 have the same phase and are combined, resulting in maximum reflection. Distance between each two adjacent electrode fingers 4 of IDT 2 is designed to be equal to half of wavelength P of the surface acoustic wave. When reflectors 3A and 3B are arranged at distances equal to an integer multiple of P, the surface acoustic wave reflects repeatedly between reflectors 3A and 3B, and a steep standing wave is formed. More specifically, sides of reflective arrays 5, closer to IDT 2, are arranged at nodes of the surface acoustic standing wave. Each electrode finger 4 of IDT 2 is most preferably arranged at an antinode of the surface acoustic standing wave. For this reason, although electrode fingers 4 of IDT 2 and reflective arrays 5 of reflectors 3A and 3B are arranged at equal distances respectively, the distances between the electrode fingers 4 and the reflective arrays 5 are different from each other. Distance d between electrode finger 4 of IDT 2 closest to reflector 3A (or 3B) and reflective array 5 of reflector 3A (or 3B) closest to IDT 2 is set to be $d=(N/2\pm\frac{1}{8})\times\lambda$, when a surface acoustic wave wavelength in resonance is given as $\lambda$. Note that N is the natural number and the sign of the double sign is determined corresponding to the sign of the reflection coefficient determined by the reflector structure. In either sign, d is not equal to $\lambda/2(=P)$.

One of the important factors in evaluating the performance of a surface acoustic wave resonator is the selectivity Q (to be referred to as "Q value" hereinafter). In general, a larger Q value is required for surface acoustic wave resonators applied to oscillators, resonance filters and the like. The Q value of a surface acoustic wave resonator is determined by losses occuring when the surface acoustic wave travelles between opposed grating reflectors. Such losses mainly include (1) propagation loss in the substrate itself, (2) external leakage loss from grating reflectors, (3) mode conversion loss from the surface acoustic wave mode to the bulk wave mode at final end portions (portions near the sides of the IDT) of grating reflectors, and the like. The loss of (1) is inherent in the crystal of the substrate and cannot be improved by designs of electrode fingers, reflective arrays or the like. The Q value determined only by the loss of (1), excluding losses of (2) and (3), is called a material Q value, and is an upper limit for the Q value.

In an actual surface acoustic wave resonator, since the losses of (2) and (3) are present, only a resonator having a Q value considerably below the material Q value can be achieved. In order to reduce the loss of (2), reflectivity of grating reflectors must be enhanced. To do this, the number of reflective arrays needs be increased, or, alternatively, reflectivity per reflective array must be enhanced. However, when the number of reflective arrays is increased, a large resonator is the inevitable result. Alternatively, an increase in resonator size can be avoided by increasing reflectivity per reflective array. However, in doing this, the mode conversion loss of (3) becomes larger in proportion to the square of the increased amount of reflectivity, resulting in a low Q value.

In order to provide a surface acoustic wave resonator with a high Q value, grating reflectors having high reflectivity and less mode conversion loss are needed. A reflector having a grooved structure in which the depth of the grooves is gradually changed, is described on pages 380 and 381 of Electronic Letters, Vol 13 No. 19 (Sept. 15th, 1977), by R. C. M. Li et al. as a reflector which can satisfy the above requirements. The grooves constituting reflective arrays of this grating reflector become deeper as they get further away from the IDT, and reflectivity thus gradually increases.

In general, if perturbation is infinitely repeated at a periodicity shorter than half the wavelength of a resonating surface acoustic wave in resonance, the bulk wave mode-converted from the surface acoustic wave is cancelled, and, as a result, formation of a radiation bulk wave does not occur. However, an actual resonator has a finite number of reflective arrays. In addition, the distance between the grating reflector and the IDT of a conventional resonator differs from that between the reflective arrays of the grating reflector and the electrode fingers of the IDT. Hence, a mode-converted bulk wave is radiated in the boundary portion between IDT 2 and grating reflectors 3A and 3B because it cannot be cancelled. In the method, in that portion of the grating reflectors near the IDT and where mode conversion occurs, the reflective array grooves can be made shallow, facilitating a corresponding lower reflectivity. In the inner portion of the grating reflectors where no radiation bulk wave is generated, the grooves can be made sufficiently deep so as to increase reflectivity. With this method, as has been stated, the Q value doubles. However, in order to form grooves whose depth gradually changes, a complex, manufacturing process which retards mass production, is sequired.

In recent years, improved surface acoustic wave resonators have been proposed in U.S. Pat. Nos. 4,454,488 (Hartmann) and 4,387,355 (Uno et al.).

In the former patent, an IDT is divided into first and second transducers, and a middle grating structure of reflective arrays is provided therebetween. The pitch between each two adjacent reflective arrays of grating reflectors and the pitch between those of the middle grating structure is set at different values, so that the surface acoustic wave propagates at the same speed in the IDT the grating reflectors and the middle grating structure. Thus, mode conversion loss is suppressed. In this prior art, the distance between two adjacent electrode fingers of the IDT is designed to be equal to half the wavelength of the surface wave (column 5, lines 65 to 66). For this reason, the electrode fingers of the IDT are shifted from the antinode of the standing wave, and the conversion efficiency of the IDT is decreased to about 80%.

The latter patent is characterized by the following points. The frequency at which the reflection factor of a reflector becomes maximum is made to coincide with the frequency at which radiation conductance of the IDT becomes maximum, in order to reduce resonance resistance. To achieve this the ratio of the distance between two adjacent electrode fingers to that between two adjacent reflective arrays is set to satisfy the resonance condition under the frequency conditions. In this prior art, the structures of the grating reflector and the IDT need not be the same. Therefore, the radiation bulk waves from the grating reflector and the IDT do not have the same intensity, and cannot be completely cancelled. For this reason, mode conversion loss cannot be suppressed.

SUMMARY OF THE INVENTION

It is an object of the present invention to provide a simple, compact surface acoustic wave resonator which can provide a high Q value without undesirably enhancing mode conversion loss, even when the reflectivity of reflective arrays is increased.

In order to achieve the above object, there is provided a surface acoustic wave resonator, comprising a piezoelectric substrate, a plurality of grating reflector means provided on a surface of said piezoelectric substrate, each grating reflector means being comprised of a plurality of reflective arrays arranged to be separate at first distances, and interdigital electric signal/surface acoustic wave transducer means provided on the surface of said piezoelectric substrate between said plurality of grating reflector means, wherein said transducer means comprises a pair of comb transducers, each of which has a plurality of electrode fingers having the same structure as that of said reflective arrays, and in which said electrode fingers of each of said comb transducers are alternately arranged to be separate at second distances, the second distance staisfying (95% of the first distance)≦(the second distance)<(the first distance) and (the first distance)<(the second distance)≦(105% of the first distance), a distance between the electrode finger of said interdigital transducer means nearest said grating reflector means and the reflective array of said grating reflector means nearest said interdigital transducer means is a third distance, the third distance satisfying (95% of the first distance)≦(the third distance)<(the first distance) and (the first distance)<(the third distance)≦(105% of the first distance), and the reflectivity of the surface acoustic wave of said reflective arrays and said electrode fingers is not less than 1%.

BRIEF DESCRIPTION OF THE DRAWINGS

FIGS. 5A and 5B are views showing propagation states of the surface acoustic standing wave in surface acoustic wave resonators according to the prior art technique and the present invention;

FIG. 6 is a graph showing the reflectivity of electrode fingers and reflective arrays with respect to the thickness of an aluminum film in the surface acoustic wave resonator according to the present invention;

DETAILED DESCRIPTION OF THE PREFERRED EMBODIMENTS

Figure 3:
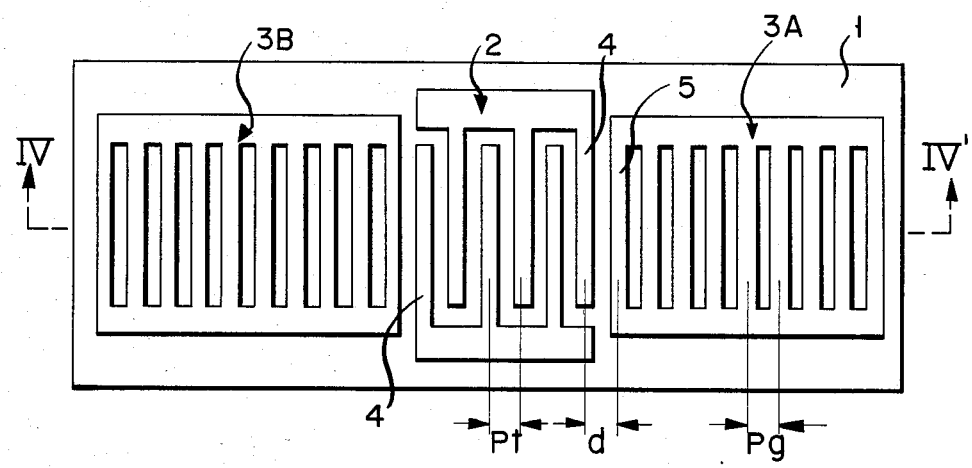
FIG. 3 is a plan view of a surface acoustic wave resonator according to a first embodiment of the present invention.
Figure 4:
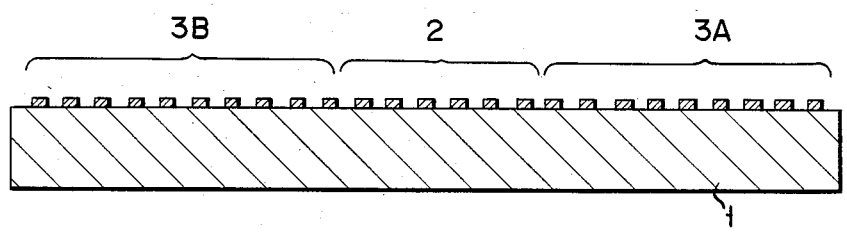
FIG. 4 is a sectional view of the first embodiment.

A surface acoustic wave resonator according to an embodiment of the present invention will be described with reference to the accompanying drawings. FIGS. 3 and 4 are, respectively, a plan view and a sectional view of the first embodiment. For piezoelectric substrate 1, and Li$_2$B$_4$O$_7$ single crystal having a (110) plane is used, and the propagation direction of the surface acoustic wave is selected to be in the Z-axis direction. IDT 2 is arranged at the center of substrate 1, and grating reflectors 3A and 3B are arranged on either side of IDT 2, as shown in FIG. 3. IDT 2 and reflectors 3A and 3B are formed of 6,000 Å thick aluminum films. Electrode fingers 4 and IDT 2 consist of the same material (aluminum) and the same thickness as reflective arrays 5 of reflectors 3A and 3B, and this is important point for present invention. Li$_2$B$_4$O$_7$ substrate 1 is etched by an aluminum etching solution, and IDT 2 and reflectors 3A and 3B are formed by the lift-off method. For this reason, electrode fingers 4 of IDT 2, and reflective arrays 5 of reflectors 3A and 3B have sharp profiles, as shown in FIG. 4.

IDT 2 comprises a pair of comb transducers, each having a plurality of electrode fingers 4 which are arranged parallel to each other at equal distances, so that electrode fingers 4 of the respective transducers are alternately arranged. Reflectors 3A and 3B have a plurality of reflective arrays 5 arranged parallel to each other at equal distances. Pitch Pg of arrays 5 of reflectors 3A and 3B is 28.0 μm, and the line width thereof is about 14.0 μm. In addition, pitch Pt of fingers 4 of IDT 2 is 27.66 μm, and the line width thereof is about 13.8 μm. Distance d between electrode finger 4 of IDT 2 nearest reflector 3A (or 3B) and reflective array 5 of reflector 3A (or 3B) nearest IDT 2 is 28.0 μm. The total number of fingers 4 of IDT 2 is 60 (30 pairs), and the number of arrays 5 of reflector 3A (or 3B) is 150 (a total number of 300). The cross length of upper and lower fingers 4 of IDT 2 is 0.7 mm.

A sample of the surface acoustic wave resonator with the above design provides a resonance frequency of 61.23 MHz, a resonance resistance of 30 Ω, and a Q value of 14500. More specifically, pitch Pg (28.0 μm) of arrays 5 of reflectors 3A and 3B and distance d (28.0 μm), between finger 4 of IDT 2, and reflective array 5 of reflector 3A (or 3B) respectively equal half the wavelength of a resonating surface acoustic wave. However, as can be seen from the previous description, pitch Pt (27.66 μm) is slightly shifted from that of the half wavelength of the resonating surface acoustic wave. In this embodiment, the amount of shift is −1.22% (=((27.66/28)−1.0)×100). Because of this, the distance between reflectors 3A and 3B is slightly shifted from an integer multiple of a half wavelength.

For the purpose of comparison, a conventional surface acoustic wave resonator was produced wherein pitch Pt of fingers 4 of IDT 2, and pitch Pg of arrays 5 of reflector 3A (or 3B) wre set to be 28.0 μm (half the wavelength of the resonating surface acoustic wave), both the line widths were set to be about 14 μm, distance d between fingers 4 and arrays 5 was set to be 21.0 μm, and other data was the same as that of the present invention. It was demonstrated from the test results that the surface acoustic wave resonator according to the present invention has a Q value three times that of the conventional resonator.

Causes of the improvement in the Q value will be described with reference to FIGS. 5A and 5B, which are, respectively, partial sectional views of the conventional surface acoustic wave resonator and the resonator according to the present invention. In the conventional arrangement of electrode fingers and reflective arrays, distance d between electrode finger 4 of IDT 2 and reflective array 5 of grating reflector 3A differs greatly from pitch Pt (the half wavelength) of fingers 4 of IDT 2 and pitch Pg (the half wavelength) of arrays 5 of reflector 3A. For this reason, as shown in FIG. 5A, the positions of fingers 4 of IDT 2 and arrays 5 of reflector 3A or 3B, relative to displacement of the surface acoustic standing wave, differ from each other. Therefore, bulk waves which are converted from the surface acoustic wave in the boundary portion between IDT 2 and reflector 3A are not cancelled, and mode conversion loss is inevitable.

According to the present invention, however, since distance d between electrode finger 4 of IDT 2 and reflective array 5 of grating reflector 3A is substantially equal to pitch Pg (the half wavelength) of the arrays 5 of the grating reflector, the positions of fingers 4 and arrays 5, relative to displacement of the surface acoustic standing wave, do not greatly differ, and a radiation bulk wave is not generated. Specifically, this is because distance d, which conventionally contributes to the generation of radiation bulk waves, is equal to pitch Pg, and pitch Pt highly approximates d and Pg. Therefore, radiation bulk wave conversion from the surface acoustic wave is cancelled and mode conversion loss does not occur. In other words, since the generation of radiation bulk waves in the boundary portion between IDT 2 and reflector 3, which conventionally causes mode conversion loss, is suppressed, conversion loss does not occur, and the Q value is thus improved.

Note that when the pitch of fingers 4 of IDT 2 coincides with that of array 5 of reflector 3, good resonance may not occur. However, according to the present invention, the pitch of fingers 4 is slightly different from that of arrays 5 of reflector 3 (in this embodiment −1.22%), and the distance between IDT 2 and reflector 3 is approximate to half the wavelength (in this embodiment, they are the same). For this reason, mode conversion loss does not occur and the Q value is improved, thereby improving the resonance characteristics. The pitch of fingers 4 is determined by reflectivity per electrode finger 4 of IDT 2, the number of electrode fingers 4 and the like, and differs by 5%, at most, of the pitch of arrays 5. When the amount of difference exceeds this limit, the suppression of radiation bulk waves cannot be effected.

As described before, since mode conversion loss increases in proportion to the square of an increase in reflectivity per electrode finger or reflective array, the effect of the present invention is noticeable in that it is realized through a resonator having high reflectivity per electrode finger or reflective array.

A change in resonant characteristics with respect to reflectivity per electrode finger or reflective array will now be explained. FIG. 6 shows test results when the reflectivity of surface acoustic waves per electrode finger or reflective array was obtained with respect to the thickness of the thin aluminum film forming the finger or array. It was assumed that a surface acoustic wave propagates in the Z-axis direction on the (110) plane of the Li$_2$B$_4$O$_7$ single crystal. As can be seen from the graph in FIG. 6, when the thickness of the thin aluminum film forming the finger or array is changed, reflectivity of the surface acoustic wave per electrode finger or reflective array can also be changed.

Figure 7:
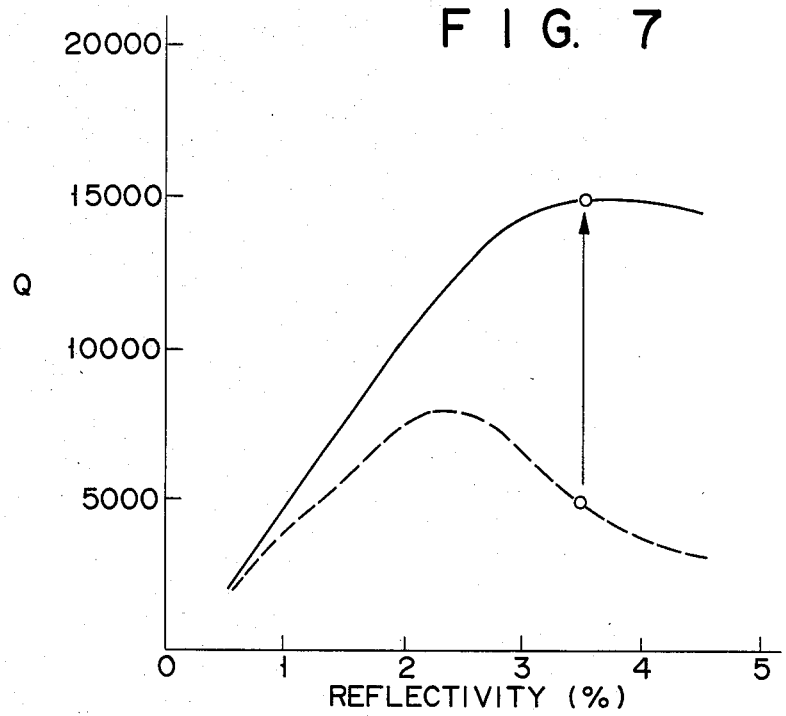
FIG. 7 is a graph showing the Q value with respect to the reflectivity of the electrode fingers and the reflective arrays in the surface acoustic wave resonators according to the prior art technique and the present invention.

FIG. 7 shows a change in Q values when the thickness of the thin aluminum film was varied from 500 Å to 8,000 Å to change the reflectivity per electrode finger or reflective array. The resonant characteristics indicated by the solid curve in FIG. 7 are those of the Q value for the surface acoustic wave resonator according to the present invention, and those indicated by the broken curve are the Q values for a conventional surface acoustic wave resonator. As reflectivity increases in the conventional surface acoustic wave resonator, the Q value also increases. When reflectivity is 2.5%, the Q value reaches its maximum (i.e., $Q \approx 8,000$). If reflectivity then exceeds 2.5%, the Q value is reduced due to the above mentioned mode conversion loss. Furthermore, when the thickness of the aluminum film is 6,000 Å like, but not that of the first embodiment, reflectivity is 3.5%, and $Q \approx 5,000$.

On the other hand, in the surface acoustic wave resonator according to the first embodiment of the present invention, when reflectivity per electrode finger or reflective array is 2 to 3% or higher, mode conversion loss is not increased. When reflectivity per electrode finger or reflective array is 3 to 4% or higher, since the surface acoustic wave leaked outside the grating reflector is decreased to a negligible extent, the Q value becomes constant. When the thickness of the aluminum film is 6,000 Å, reflectivity is 3.5%, and the Q value becomes a value close to 15,000, achieving a three-fold improvement over a conventional resonator. For this reason, since reflectivity per electrode finger or reflective array can be increased, and the number of reflective arrays and electrode fingers can be decreased, a compact resonator results. As can be seen from FIG. 7, the effect of the present invention becomes particularly notable when reflectivity per electrode finger or reflective array is 1% or higher.

When reflectivity is small, both the resonators shown in FIG. 7 have a small Q value. This is because since the number of reflective ararys is small (i.e., 150), the influence of leakage of the surface acoustic wave outside the grating reflector cannot be ignored.

Figure 8:
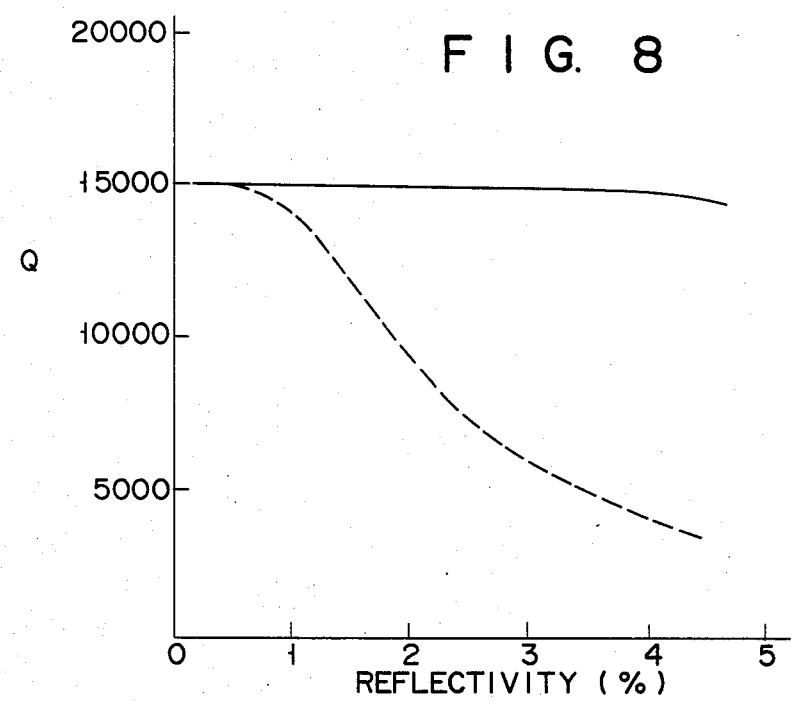
FIG. 8 is a graph showing a simulated result of the Q value in the surface acoustic wave resonators according to the prior art technique and that of the present invention, when the number of the reflective arrays of a grating reflector is assumed to be infinite.

Conversely, when the number of reflective arays in the grating reflector is increased and reflectivity per reflective array is decreased, the loss due to acoustic surface wave leakage outside the grating reflector can be ignored, thus causing no decrease in the Q value. FIG. 8 shows test results when the number of reflective arrays in the grating reflector was made inifinite, and the Q-value characteristics with respect to reflectivity were simulated taking reflectivity per reflective array and bulk mode conversion loss into consideration. The solid curve and broken curve, respectively, show the characteristics of the present invention and the conventional resonator. As is apparent from the results, when reflectivity exceeds 1%, the effect of the present invention becomes particularly noticeable. Normally, when reflectivity of the reflective array exceeds 1%, mode conversion loss to bulk wave mode exceeds propagation loss inherent in the substrate, and conventionally, the Q value is considerably reduced.

In this embodiment, since the pitch of electrode fingers 4 of IDT 2 differs slightly from half the wavelength of the surface acoustic wave, and despite location of electrode fingers 4, near the grating reflectors, at positions shifted from antinodes of the standing surface wave, the incoincidence gradually decreases apart from the grating reflector and then electrode fingers 4 are exactly located at the antinodes in the central portion of IDT 2. As a result, conversion efficiency of the IDT is not decreased below 90%, and is superior to the U.S. Pat. No. 4,454,488.

The same tests were conducted using $LiTaO_3$ and crystal for the substrate. Although the absolute value of the Q value differs depending on the loss in the substrate itself, the tendency for change in resonance characteristics with respect to the thickness of the aluminum film was the same as that shown in FIG. 7.

Another embodiment of the present invention will be described hereinafter.

In the first embodiment, although electrode fingers of the IDT and reflective arrays of the grating reflectors are formed of aluminum thin films, the present invention is not limited to this. They can be of conductive materials such as a material in which an inpurity (e.g., copper, silicon, or the like) is doped in aluminum, gold, or a double-layered structure of gold and titanium, or of chromium and gold, or the like.

Figure 9:
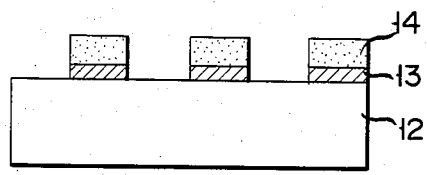
FIG. 9 is a sectional view showing a modification of the reflective arrays of the surface acoustic wave resonator according to the present invention.
Figure 10:
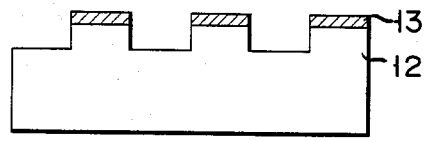
FIG. 10 is a sectional view showing another modification of the reflective arrays of the surface acoustic wave resonator according to the present invention.
Figure 11:
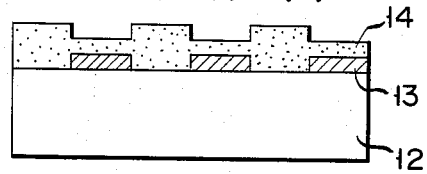
FIG. 11 is a sectional view showing still another modification of the reflective arrays of the surface acoustic wave resonator according to the present invention.

Moreover, dielectric film 14 can be formed on metal film 13, as shown in FIG. 9. Grooves can be formed in substrate 12 using metal film 13 as a mask, as shown in FIG. 10. Dielectric film 14 can be formed on metal film 13 and grooves can be formed in a surface of the substrate. Whichever the case, it is important that electrode fingers of the IDT and reflective arrays of grating reflectors have the same structure (material and thickness).

Figure 1:
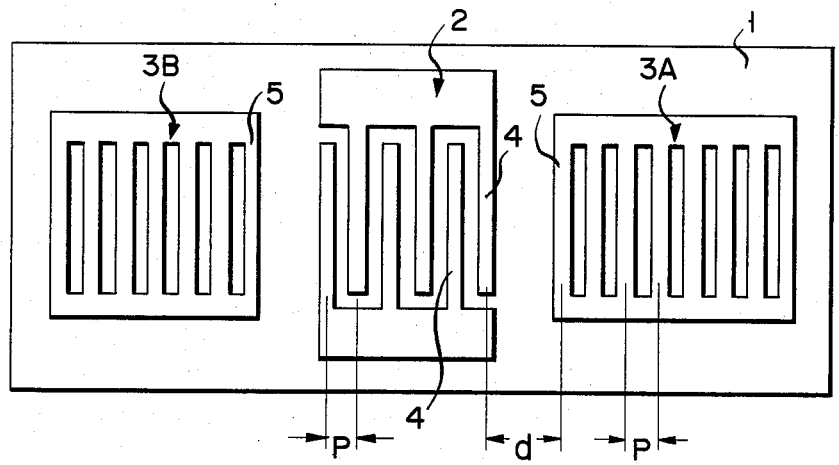
FIG. 1 is a plan view of a conventional surface acoustic wave resonator.
Figure 2A:
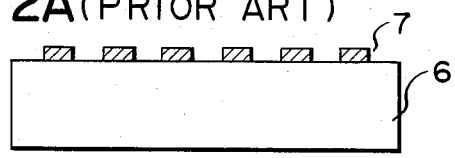
FIGS. 2A to 2C are sectional views showing structures of reflective arrays of the conventional surface acoustic wave resonator.
Figure 2B:
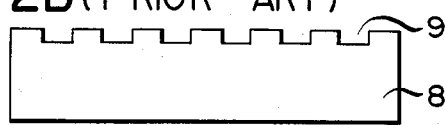
Figure 2C:
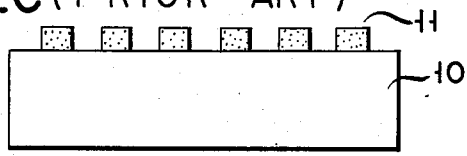

In the first embodiment, a substrate such as an $Li_2B_4O_7$ substrate having the small electromechanical coupling factor $K^2$ is used. However, a substrate having a large $K^2$ value can be used. Normally, when reflective arrays are formed on the substrate with metal films, reflectivity is $K^2/\pi$. For this reason, a substrate such as a $LiNbO_3$ substrate having a large $K^2$ value has $K^2 > 0.03$ even when the thickness of the metal film of the reflective array is decreased. Therefore, reflectivity exceeds 1% and it is difficult to suppress mode conversion loss. Conventionally, when $LiNbO_3$ is used for the substrate, only when the groove structure shown in FIG. 2B is employed for the reflective arrays can a resonator having $Q > 30,000$ be achieved. A resonator having $Q > 8,000$ has not yet been reported when the metal thin film structure shown in FIG. 2A is employed for the reflective arrays. However, when electrode fingers and reflective arrays are arranged according to the present invention, a high Q value can be achieved without employing a complicated grooved structure for the reflective arrays, even when reflective arrays having a simple thin metal film structure are used.

In substances such as $LiTaO_3$ 36° Y-cut X-propagation substrates, quartz 35° Y-cut Z'-propagation substrates and the like which generate pseudo surface acoustic waves, since the surface acoustic wave propagates in the substrate surface while slightly radiating the bulk wave inside the substrate, apparent propagation loss is large. However, if energy is concentrated on the substrate surface in a manner such that a thin film of a material such as a metal or dielectric having low propagation velocity of the surface acoustic wave is formed on the substrate surface, bulk waves will not be produced. For this reason, when the IDT and grating reflectors are formed of thin metal films such as aluminum, having a sufficnet film thickness, the propagation loss can be suppressed even when the aforementioned substrates are used. However, with a conventional arrangement, since the positions of the IDT and the grating reflectors relative to displacement of the surface acoustic standing wave are differ greatly from each other, the radiation bulk mode is present, and a resonator having a high Q value cannot be realized. In contrast, with the arrangement according to the present invention, since the positions of the electrode fingers of the IDT and the reflective arrays of the grating reflectors relative to displacement of the surface acoustic standing wave are not greatly different, the radiation bulk mode does not occur, and resonators having high Q values can be realized even when the above-mentioned substrates are used.

Figure 12:
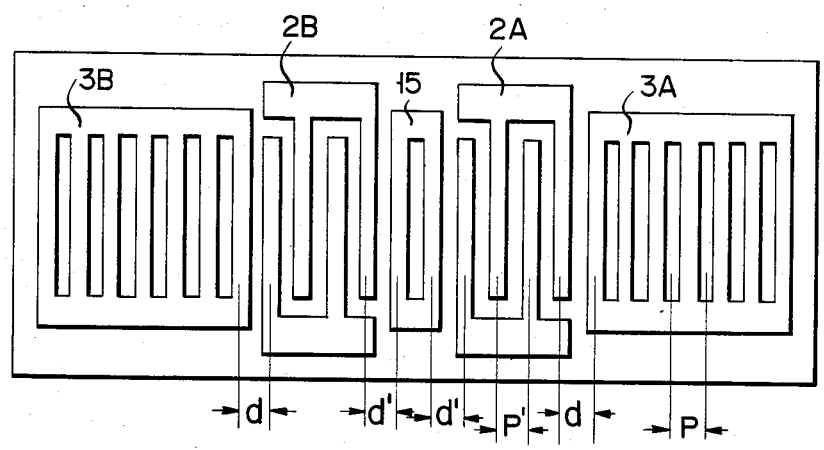
FIG. 12 is a plan view showing a surface acoustic wave resonator according to a second embodiment of the present invention.

Furthermore, the present invention can be applied to a so-called 2-port type surface acoustic wave resonator wherein an IDT at the center of the substrate is divided into first and second transducers, and a grating reflector is provided therebetween. FIG. 12 shows a resonator of this type.

Two IDTs 2A and 2B ar provided between two opposing grating reflectors 3A and 3B. Grating reflector 15 is provided between two IDTs 2A and 2B. Pitch p of reflective arrays is set to be half the wavelength of the surface acoustic wave in the resonance mode and pitch p' of IDT is set to fall within the range of between 95% and 105% of p but not equal to p. Distance d between grating reflector 3A (or 3B) and IDT 2A (or 2B), and distance d' between IDT 2A (or 2B) and grating reflector 15 are set to fall within the range of between 95% and 105% of p. Thus, mode conversion loss from the surface acoustic wave to bulk wave can be suppressed in the same manner as in the first embodiment. This configuration is very similar to the prior art (U.S. Pat. No. 4,454,488), but exactly different at the point that pitch p' of electrode finger is not equal to pitch p of reflective array. Consequently conversion efficiency of IDT is superior to the prior art.

The present invention can be applied to a structure wherein no grating reflector 15 is provided between IDTs 2A and 2B, and to a structure wherein a plurality of IDTs are simply provided adjacent to each other between two grating reflectors.

As described above, according to the present invention, the distance between respective electrode fingers of the IDT and respective reflective arrays of the grating reflectors is set to a value approximate to the distance between the IDT and the grating reflector. For this reason, the positions of the electrode fingers or the reflective arrays relative to displacement of the surface acoustic standing wave do not differ. Therefore, since the radiation bulk wave is not generated and mode conversion loss cannot occur, a surface acoustic wave resonator having a high Q value can be provided. Furthermore, since the mode conversion loss does not occur, reflectivity per electrode finger or reflective array can be increased and the number of reflective arrays and electrode fingers can be decreased, thus reducing the size of the resonator in comparison with the conventional resonator.

What is claimed is:

1. A surface acoustic wave resonator comprising:
a piezoelectric substrate;
a plurality of grating reflector means provided on a surface of said piezoelectric substrate, each grating reflector means being comprised of a plurality of reflective arrays arranged to be separated by first distances; and
interdigital electric signal/surface acoustic wave transducer means provided on the surface of said piezoelectric substrate between said plurality of grating reflector means, wherein said transducer means comprises a pair of comb transducers, each of which has a plurality of electrode fingers having the same structure as that of said reflective arrays, and in which said electrode fingers of each of said comb transducers are alternatively arranged and separate by second distances, the second distances satisfying (95% of the first distance)≦(each second distance)<(the first distance) or (the first distance)<(each second distance)≦(105% of the first distance), a distance between the electrode finger of said interdigital transducer means nearest said grating reflector means and the reflective array of said grating reflector means nearest said interdigital transducer means is a third distance, the third distance satisfying (95% of the first distance)≦(the third distance)<(the first distance) or (the first distance)<(the third distance)≦(105% of the first distance), and the reflectivity of the surface acoustic wave of said reflective arrays and said electrode fingers is not less than 1%.

2. A surface acoustic wave resonator according to claim 1, in which the first distance is equal to half a wavelength of the surface acoustic wave.

3. A surface acoustic wave resonator according to claim 1, in which the second and third distances are equal to 98.8% of the first distance.

4. A surface acoustic wave resonator according to claim 1, in which the reflectivity of the surface acoustic wave of said reflective arrays and said electrode fingers is 3.5%.

5. A surface acoustic wave resonator according to claim 1, in which each of said reflective arrays and said electrode fingers comprises a metal film formed on said piezolectric substrate, and a dielectric film formed on said metal film.

6. A surface acoustic wave resonator according to claim 1, in which each of said reflective arrays and said electrode fingers comprises a groove formed in said piezoelectric substrate, using a metal film as a mask.

7. A surface acoustic wave resonator according to claim 1, in which each of said reflective arrays and said electrode fingers comprises a metal film formed on said piezoelectric substrate, and a dielectric film formed on said metal film and having a grooved surface.

8. A surface acoustic wave resonator according to claim 1, in which said transducer means comprises a plurality of pairs of comb-shaped transducers.

9. A surface acoustic wave resonator according to claim 8, in which a grating reflector means is provided between two adjacent pairs of said plurality of pairs of comb-shaped transducers.

10. A surface acoustic wave resonator according to claim 1, in which said piezoelectric substrate is formed of $Li_2B_4O_7$ single crystals.

11. A surface acoustic wave resonator according to claim 1, in which said electrode fingers of said transducer means are arranged to be separate at the same second distances.

12. A surface acoustic wave resonator according to claim 1, in which said electrode fingers of said transducer means are arranged to be separate at different second distances.

13. A surface acoustic wave resonator according to claim 1, in which said surface wave is a pseudo surface acoustic wave.

* * * * *

UNITED STATES PATENT AND TRADEMARK OFFICE
CERTIFICATE OF CORRECTION

PATENT NO. : 4,635,009
DATED : January 6, 1987
INVENTOR(S) : Yasuo EBATA

It is certified that error appears in the above-identified patent and that said Letters Patent is hereby corrected as shown below:

Column 4, line 8, change "and" to --or--;

line 15, change "and" to --or--.

Signed and Sealed this

Third Day of November, 1998

*Attest:*

BRUCE LEHMAN

*Attesting Officer*  *Commissioner of Patents and Trademarks*